(12) United States Patent
Lee et al.

(10) Patent No.: US 9,324,740 B2
(45) Date of Patent: Apr. 26, 2016

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Young-Jang Lee, Seoul (KR); Ho-Young Jeong, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/575,321

(22) Filed: Dec. 18, 2014

(65) Prior Publication Data

US 2015/0179724 A1 Jun. 25, 2015

(30) Foreign Application Priority Data

Dec. 23, 2013 (KR) .................. 10-2013-0161519

(51) Int. Cl.
*H01L 27/32* (2006.01)
*H01L 27/12* (2006.01)
*H01L 29/786* (2006.01)

(52) U.S. Cl.
CPC ............ *H01L 27/1259* (2013.01); *H01L 27/32* (2013.01); *H01L 27/3241* (2013.01); *H01L 27/3244* (2013.01); *H01L 27/3265* (2013.01); *H01L 29/7869* (2013.01); *H01L 2227/323* (2013.01)

(58) Field of Classification Search
CPC ............ H01L 27/1259; H01L 27/3244; H01L 27/3241; H01L 27/32; H01L 27/3265
See application file for complete search history.

(56) References Cited

U.S. PATENT DOCUMENTS

| 9,087,751 B2 * | 7/2015 | Choi | H01L 29/4908 |
| 2006/0108916 A1 * | 5/2006 | Koo | H01L 27/3262 313/504 |
| 2007/0152574 A1 * | 7/2007 | Choi | H01L 27/12 313/506 |
| 2008/0012481 A1 * | 1/2008 | Park | H01L 27/3244 313/506 |
| 2008/0029767 A1 * | 2/2008 | Nagata | G02F 1/1368 257/72 |
| 2008/0237585 A1 * | 10/2008 | Kim | H01L 27/3265 257/40 |
| 2008/0315189 A1 * | 12/2008 | Lee | G09G 3/3233 257/40 |
| 2011/0193475 A1 * | 8/2011 | Kim | H01L 27/3251 313/504 |
| 2012/0043546 A1 * | 2/2012 | Oh | H01L 27/1255 257/59 |
| 2013/0044095 A1 * | 2/2013 | Heo | H01L 27/3276 345/211 |
| 2013/0119388 A1 * | 5/2013 | Lee | H01L 51/5265 257/59 |
| 2014/0131666 A1 * | 5/2014 | Song | H01L 51/5275 257/40 |
| 2014/0299843 A1 * | 10/2014 | Kim | H01L 27/3265 257/40 |
| 2015/0255017 A1 * | 9/2015 | Kim | G09G 3/3258 315/172 |

* cited by examiner

*Primary Examiner* — Michele Fan
(74) *Attorney, Agent, or Firm* — Fenwick & West LLP

(57) ABSTRACT

An organic light emitting diode display device comprises a driving thin film transistor including a first semiconductor layer, a gate insulating layer formed on the first semiconductor layer. The device further includes a storage capacitor including a first capacitor electrode electrically coupled to a drain electrode of the driving thin film transistor, a buffer layer formed on the first capacitor electrode, a second semiconductor layer formed on the buffer layer, and a second capacitor electrode formed on the second semiconductor layer and electrically coupled to a gate electrode of the driving thin film transistor. The device also includes an organic light emitting diode connected to the drain electrode of the driving transistor. The gate insulating layer has at least one hole in a region where the gate insulating layer overlaps the second semiconductor layer, thereby exposing the second semiconductor layer to the second capacitor electrode.

11 Claims, 12 Drawing Sheets

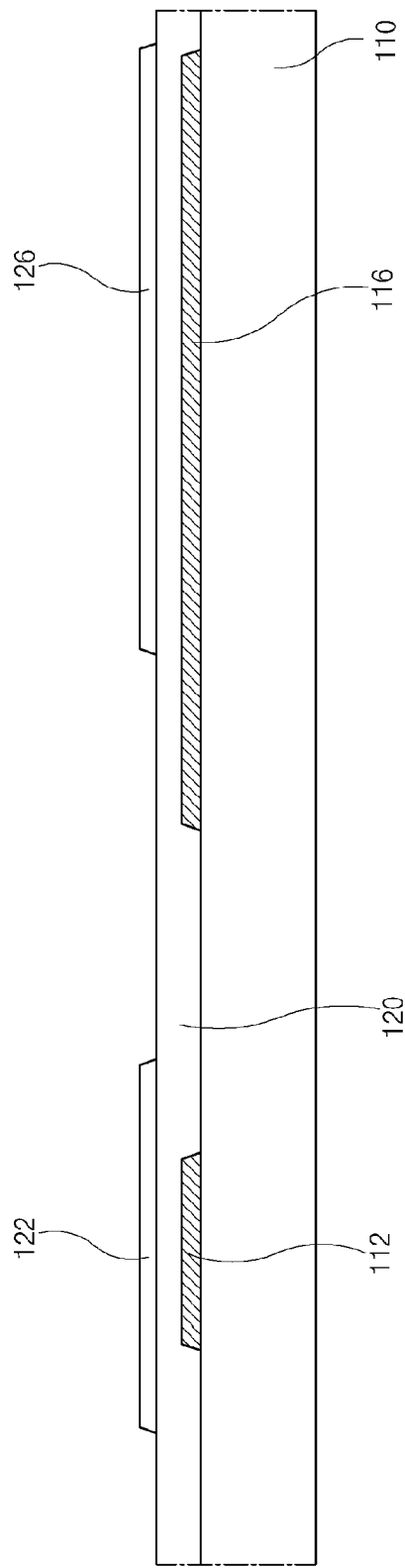
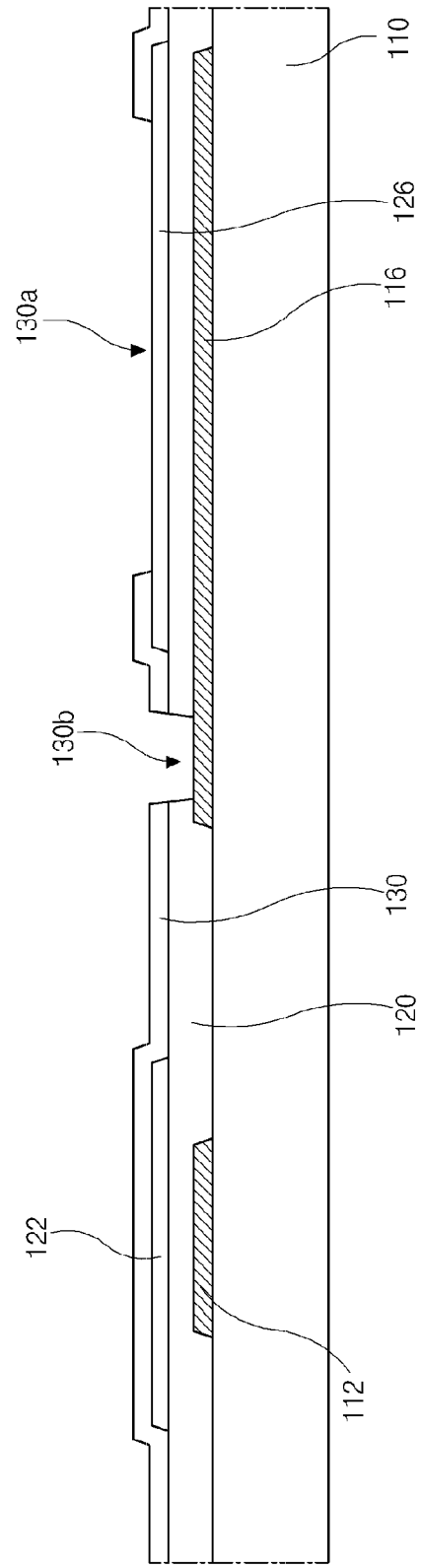
FIG. 3B
FIG. 3C

ORGANIC LIGHT EMITTING DIODE DISPLAY DEVICE AND METHOD OF FABRICATING THE SAME

CROSS-REFERENCE TO RELATED APPLICATION

The present application claims the priority benefit of Korean Patent Application No. 10-2013-0161519 filed in the Republic of Korea on Dec. 23, 2013, which is hereby incorporated by reference in their entirety.

BACKGROUND

1. Field of the Disclosure

The present disclosure relates to an organic light emitting diode display device, and more particularly, to an organic light emitting diode display device that increases capacitance of a storage capacitor and a method of fabricating the same.

2. Discussion of the Related Art

Recently, flat panel displays have been widely developed and applied to various fields because of their thin profile, light weight, and low power consumption.

Among the flat panel displays, organic light emitting diode (OLED) display devices, which may be referred to as organic electroluminescent display devices, emit light during loss of electron-hole pairs formed by injecting charges into a light emitting layer between a cathode for injecting electrons and an anode for injecting holes.

The OLED display devices include a flexible substrate such as plastic; because they are self-luminous, the OLED display devices have excellent contrast ratios; the OLED display devices have a response time of several micro seconds, and there are advantages in displaying moving images; the OLED display devices have wide viewing angles and are stable under low temperatures; since the OLED display devices are driven by a low voltage of direct current (DC) 5V to 15V, it is easy to design and manufacture driving circuits; and the manufacturing processes of the OLED display device are simple since only deposition and encapsulation steps are required.

The OLED display devices are classified into a passive matrix type and an active matrix type according to driving methods. Active matrix type display devices have been widely used because of their low power consumption, high definition and large-sized possibility.

FIG. 1 is a circuit diagram of one pixel region of an OLED display device according to the related art.

As shown in FIG. 1, an OLED display device includes a gate line GL, a data line DL, a switching thin film transistor Ts, a driving thin film transistor Td, a storage capacitor Cst and a light emitting diode De. The gate line GL and the data line DL cross each other to define a pixel region P. The switching thin film transistor Ts, the driving thin film transistor Td, the storage capacitor Cst and the light emitting diode De are formed in the pixel region P.

More particularly, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light emitting diode De is connected to a drain electrode of the driving thin film transistor Td, and a cathode of the light emitting diode De is connected to a low voltage supply VSS. The storage capacitor Cst is connected to the gate electrode and the drain electrode of the driving thin film transistor Td.

In operation of the OLED display device, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts. When the driving thin film transistor Td is turned on by the data signal, an electric current flowing through the light emitting diode De is controlled, thereby displaying an image. The light emitting diode De emits light due to the current supplied through the driving thin film transistor Td from the high voltage supply VDD.

Namely, the amount of the current flowing through the light emitting diode De is proportional to the magnitude of the data signal, and the intensity of light emitted by the light emitting diode De is proportional to the amount of the current flowing through the light emitting diode De. Thus, the pixel regions P show different gray levels depending on the magnitude of the data signal, and as a result, the OLED display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode De to be constant and the gray level shown by the light emitting diode De to be maintained until a next frame.

To do this, capacitance of the storage capacitor Cst needs to be over a predetermined value. However, to implement high definition display devices, the size of the pixel region P decreases, and an area for the storage capacitor Cst also decreases. Therefore, the capacitance of the storage capacitor Cst is lowered. If the area for the storage capacitor Cst is increased, an effective emission area and an area for a compensation circuit are restricted. Accordingly, it is difficult to obtain sufficient capacitance of the storage capacitor Cst.

SUMMARY

Accordingly, the present disclosure is directed to an organic light emitting diode display device and a method of fabricating the same that substantially obviate one or more of the problems due to limitations and disadvantages of the related art.

An object of the present disclosure is to provide an organic light emitting diode display device and a method of fabricating the same that increase capacitance of a storage capacitor and improve the aperture ratio and brightness.

Another object of the present disclosure is to provide organic light emitting diode display device and a method of fabricating the same that increase design margins.

Additional features and advantages of these embodiments will be set forth in the description which follows, and in part will be apparent from the description, or may be learned by practice of the embodiments. The objectives and other advantages will be realized and attained by the structure particularly pointed out in the written description and claims hereof as well as the appended drawings.

To achieve these and other advantages and in accordance with the purpose of the present disclosure, as embodied and broadly described herein, according to one or more embodiments, an organic light emitting diode display device includes a driving thin film transistor including a first semiconductor layer, a gate insulating layer formed on the first semiconductor layer, a gate electrode formed on the gate insulating layer, a source electrode, and a drain electrode, the source electrode and the gate electrode formed co-planar with the gate electrode on a same side with respect to the gate insulating layer. The device further comprises a storage capacitor including a first capacitor electrode electrically coupled to the drain electrode of the driving thin film transistor, a buffer layer formed on the first capacitor electrode, a second semiconductor layer formed on the buffer layer, and a second capacitor electrode formed on the second semiconductor layer and electrically coupled to the gate electrode of the driving thin film transistor The device additionally includes an organic light emitting diode (OLED) connected to the drain electrode of the driving thin film transistor and configured to emit light by current driven through the OLED by the driving thin film transistor. In one or more embodiments, the gate insulating layer has at least one hole in a region where the gate insulating layer overlaps the second semiconductor layer, thereby exposing the second semiconductor layer to the second capacitor electrode.

In another aspect, a method of fabricating an organic light emitting diode display device includes forming a driving thin film transistor including a first semiconductor layer, a gate insulating layer formed on the first semiconductor layer, a gate electrode formed on the gate insulating layer, a source electrode, and a drain electrode, the source electrode and the gate electrode formed co-planar with the gate electrode on a same side with respect to the gate insulating layer; forming a storage capacitor including a first capacitor electrode electrically coupled to the drain electrode of the driving thin film transistor, a buffer layer formed on the first capacitor electrode, a second semiconductor layer formed on the buffer layer, and a second capacitor electrode formed on the second semiconductor layer and electrically coupled to the gate electrode of the driving thin film transistor; and forming an organic light emitting diode (OLED) connected to the drain electrode of the driving thin film transistor and configured to emit light by current driven through the OLED by the driving thin film transistor. In one or more embodiments, the buffer layer, the second semiconductor layer and the gate insulating layer are formed subsequent to forming of the first capacitor electrode and prior to forming of the second capacitor electrode. In one or more embodiments, forming the gate insulating layer includes forming at least one hole in the gate insulating layer in a region where the gate insulating layer overlaps the second semiconductor layer by patterning the gate insulating layer to expose the second semiconductor layer through the gate insulating layer to the second capacitor electrode.

In another aspect, a method of fabricating an organic light emitting diode display device includes forming a first capacitor electrode over a substrate; forming a buffer layer over the first capacitor electrode; forming a first semiconductor layer and a second semiconductor layer over the buffer layer; and forming a gate insulating layer over the first semiconductor layer and the second semiconductor layer. The method also comprises forming at least one hole in the gate insulating layer in a region where the gate insulating layer overlaps the second semiconductor layer by patterning the gate insulating layer, the hole exposing the second semiconductor layer through the gate insulating layer. The method further comprises forming a gate electrode on the gate insulating layer and forming a second capacitor electrode on the second semiconductor layer in the hole of the gate insulating layer, the second capacitor electrode being electrically coupled to the gate electrode. The method additionally comprises forming an inter insulating layer over the gate electrode and the second capacitor electrode; forming source and drain electrodes over the inter insulating layer, the drain electrode being electrically coupled to the first capacitor electrode; forming a passivation layer over the source and drain electrodes; and sequentially forming a first OLED electrode, an organic light emitting layer and a second OLED electrode over the passivation layer.

In one or more embodiments, an organic light emitting display (OLED) device comprises a thin film transistor that includes a first semiconductor layer on a buffer layer, a gate insulating layer on the first semiconductor layer, a gate electrode, a source electrode, and a drain electrode. The device further comprises a first capacitor electrically coupled between the gate electrode and either the drain electrode or the source electrode of the thin film transistor, the first capacitor formed in a second region of the substrate, the first capacitor including a first capacitor electrode, the buffer layer on the first capacitor electrode, a second semiconductor layer on the buffer layer, and a second capacitor electrode on the second semiconductor layer. In one or more embodiments, the second semiconductor layer is thinner than the gate insulating layer.

In one or more embodiments, an organic light emitting display (OLED) device comprises a thin film transistor formed in a first region of a substrate; an OLED formed in a second region of the substrate; a first capacitor coupled between a gate electrode and a drain electrode of the thin film transistor, the first capacitor formed at least partially in the second region of the substrate; and a second capacitor adjacent to the first capacitor and formed at least partially in the second region of the substrate, the second capacitor coupled between the gate and the drain electrodes of the thin film transistor and connected in parallel with the first capacitor.

It is to be understood that both the foregoing general description and the following detailed description are exemplary and explanatory and are intended to provide further explanation of the embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3A to 3J are cross-sectional views of an OLED display device in steps of fabricating the display device according to an embodiment of the present disclosure.

DETAILED DESCRIPTION OF THE PREFERRED EMBODIMENTS

Reference will now be made in detail to the preferred embodiment, examples of which are illustrated in the accompanying drawings.

Figure 1:
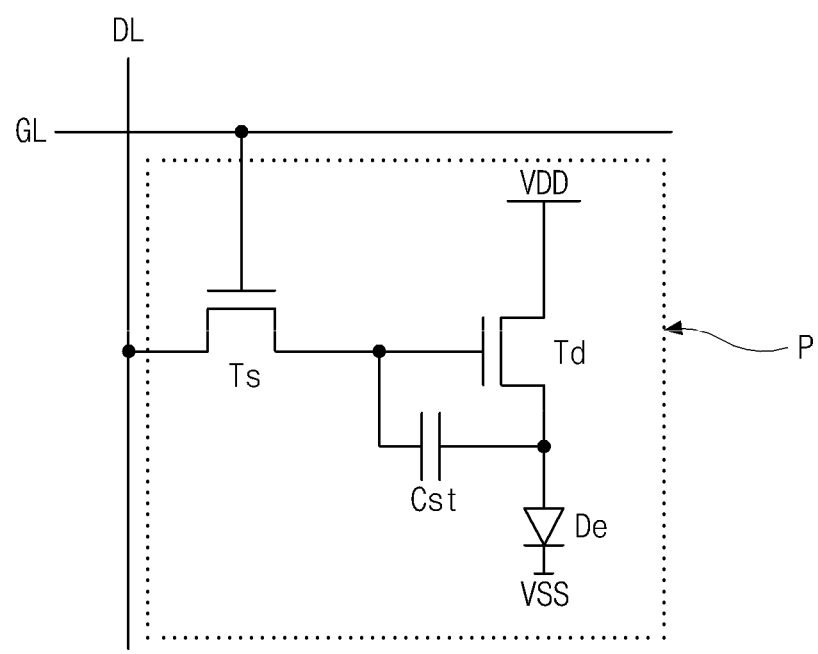
FIG. 1 is a circuit diagram of one pixel region of an OLED display device according to the related art.
Figure 2:
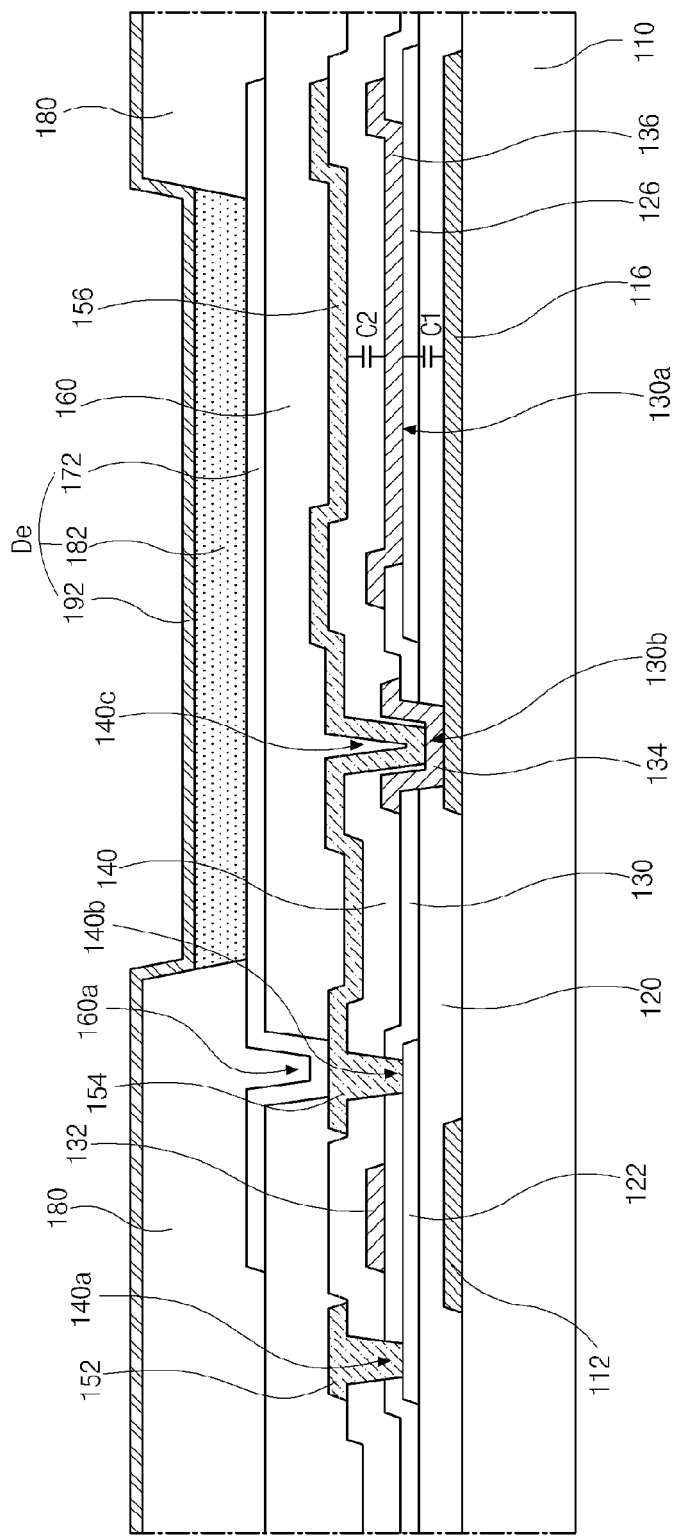
FIG. 2 is a cross-sectional view of an OLED display device according to an embodiment of the present disclosure.

FIG. 2 is a cross-sectional view of an OLED display device according to an embodiment of the present invention. FIG. 2 shows one pixel region.

In FIG. 2, a light-blocking layer 112 and a first capacitor electrode 116 of a conductive material such as metal are formed on an insulating substrate 110.

A buffer layer 120 of an insulating material is formed on the light-blocking layer 112 and the first capacitor electrode 116 substantially all over the substrate 110.

A first oxide semiconductor layer 122 and a second oxide semiconductor layer 126 of an oxide semiconductor material are formed on the buffer layer 120. The first oxide semiconductor layer 122 is disposed over the light-blocking layer 112, and the second oxide semiconductor layer 126 is disposed over the first capacitor electrode 116. The first oxide semiconductor layer 122 has a wider width than the light-blocking layer 112, and a central portion of the first oxide semiconductor layer 122 overlaps the light-blocking layer 112. The second oxide semiconductor layer 126 overlaps the first capacitor electrode 116. At this time, the second oxide semiconductor layer 126 has a smaller area than the first capacitor electrode 116, and a portion of the first capacitor electrode 116 does not overlap the second oxide semiconductor layer 126.

A gate insulating layer 130 of an insulating material is formed on the first oxide semiconductor layer 122 and the second oxide semiconductor layer 126 substantially all over the substrate 110. The gate insulating layer 139 has a hole 130a exposing the second oxide semiconductor layer 126 and a capacitor contact hole 130b exposing the first capacitor electrode 116. The capacitor contact hole 130b is also formed in the buffer layer 120 under the gate insulating layer 130. Meanwhile, although not shown in the figure, the gate insulating layer 130 and the buffer layer 120 have a gate contact hole exposing the light-blocking layer 112.

A gate electrode 132, a connection pattern 134 and a second capacitor electrode 136 of a conductive material such as metal are formed on the gate insulating layer 130. In addition, a gate line (not shown) is formed on the gate insulating layer 130. The gate line extends in a first direction.

The gate electrode 132 overlaps the light-blocking layer 112 and has a narrower width than the light-blocking layer 112. Although not shown in the figure, the gate electrode 132 contacts the light-blocking layer 112 through the gate contact hole. Additionally, the connection pattern 134 contacts the first capacitor electrode 116 through the capacitor contact hole 130b. The second capacitor electrode 136 is spaced apart from the connection pattern 134, and the second capacitor electrode 136 overlaps the first capacitor electrode 116 and contacts the second oxide semiconductor layer 126 through the hole 130a. Although not shown in the figure, the second capacitor electrode 136 is connected to the gate electrode 132.

An inter insulating layer 140 of an insulating material is formed on the gate electrode 132, the connection pattern 134 and the second capacitor electrode 136 substantially all over the substrate 110. The inter insulating layer 140 includes first and second contact holes 140a and 140b exposing top surfaces of both sides of the first oxide semiconductor layer 122. The first and second contact holes 140a and 140b are spaced apart from the gate electrode 132, and the first and second contact holes 140a and 140b are also formed in the gate insulating layer 130. In addition, the inter insulating layer 140 has a third contact hole 140a exposing the connection pattern 134.

A source electrode 152, a drain electrode 154 and a third capacitor electrode 156 of a conductive material such as metal are formed on the inter insulating layer 140. In addition, a data line (not shown) a power supply line (not shown) are formed on the inter insulating layer 140. The data line and the power supply line extend in a second direction. The data line crosses the gate line to define a pixel region.

The source and drain electrodes 152 and 154 are spaced apart from each other with respect to the gate electrode 132. The source and drain electrodes 152 and 154 contact both sides of the first oxide semiconductor layer 122 through the first and second contact holes 140a and 140b, respectively. The source and drain electrodes 152 and 154 are spaced apart from the gate electrode 132 and overlap the light-blocking layer 112. The drain electrode 154 is connected to the third capacitor electrode 156 and contacts the connection pattern 134 through the third contact hole 140c. In the meantime, the third capacitor electrode 156 overlaps the second capacitor electrode 136.

Here, the drain electrode 154 may directly contact the first capacitor electrode 116. Namely, the capacitor contact hole 130a and the connection pattern 134 may be omitted, and the third contact hole 140c may be formed in the inter insulating layer 140, the gate insulating layer 130 and the buffer layer 120 to expose the first capacitor electrode 116. The drain electrode 154 may contact the first capacitor electrode 116 through the third contact hole 140c.

Meanwhile, the first capacitor electrode 116 and the second capacitor electrode 136 form a first capacitor C1 with the buffer layer 120 and the second oxide semiconductor layer 126 interposed therebetween as a dielectric. The second capacitor electrode 136 and the third capacitor electrode 156 form a second capacitor C2 with the inter insulating layer 140 interposed therebetween as a dielectric. The first capacitor C1 and the second capacitor C2 are connected to each other in parallel to constitute a storage capacitor. In other words, in one or more embodiments, the first capacitor electrode 116 and the third capacitor electrode 156 are both connected to either a source 152 or a drain electrode 154 of the thin film transistor through a common connection pattern 134 through the third contact hole 140c. Both the gate insulating layer 130 and the inter insulating layer 140 absent in a vicinity of the connection pattern 134.

A passivation layer 160 of an insulating material is formed on the source and drain electrodes 152 and 154 and the third capacitor electrode 156 substantially all over the substrate 110. The passivation layer 160 has a flat top surface and has a drain contact hole 160a exposing the drain electrode 154. In the figure, although the drain contact hole 160a is formed directly over the second contact hole 140b, the drain contact hole 160a may be spaced apart from the second contact hole 140b.

A first electrode 172 of a conductive material having relatively high work function is formed on the passivation layer 160. The first electrode 172 is disposed in each pixel region and contacts the drain electrode 154 through the drain contact hole 160a. Here, the first electrode 172 may be formed of a transparent conductive material.

A bank layer 180 of an insulating material is formed on the first electrode 172. The bank layer 180 covers edges of the first electrode 172 and exposes a central portion of the first electrode 172.

An organic light emitting layer 182 of an organic material is formed on the first electrode 172 exposed by the bank layer 180. The organic light emitting layer 182 may have a multi-layered structure of a hole transporting layer, a light-emitting material layer, and an electron transporting layer sequentially layered on the first electrode 172. The organic light emitting layer 182 may further include a hole injecting layer under the hole transporting layer and an electron injecting layer on the electron transporting layer.

A second electrode 192 of a conductive material having relatively low work function is formed on the organic light emitting layer 182 substantially all over the substrate 110. The second electrode 192 may be formed of an opaque metallic material.

The first electrode 172, the organic light emitting layer 182 and the second electrode 192 constitute an organic light emitting diode De. The first electrode 172 functions as an anode, and the second electrode 192 serves as a cathode. Here, the OLED display device may be a bottom emission type in which light from the organic light emitting layer 182 is outputted to the outside through the first electrode 172.

In the meantime, the gate electrode 132, the first oxide semiconductor layer 122, the source electrode 152 and the drain electrode 154 constitute a thin film transistor. The thin film transistor may have a top gate-type coplanar structure in which the first oxide semiconductor layer 122 as an active layer is disposed at the bottom, the gate electrode 132 is disposed at the top, and the gate electrode 132 and the source and drain electrodes 152 and 154 are disposed at a side of the oxide semiconductor layer 122.

In the present embodiments, since the light-blocking layer 112 is formed under the first oxide semiconductor layer 122, light from the outside or light from the organic light emitting layer 182 is prevented from reaching the first oxide semiconductor layer 122. The first oxide semiconductor layer 122 is prevented from being degraded by light, and a lifetime of the thin film transistor is prevented from being shortened. Moreover, the light-blocking layer 112 is electrically connected to the gate electrode 132 at the top and is used as an additional gate electrode. Thus, the thin film transistor of the present invention has a double gate structure and has further improvement in current characteristics.

The thin film transistor of FIG. 2 corresponds to a driving thin film transistor of an OLED display device. Although not shown in the figure, a switching thin film transistor, which has the same structure as the driving thin film transistor, is formed over the substrate 110.

In addition, a sensing thin film transistor having the same structure as the driving thin film transistor may be further formed.

Here, a gate electrode of the switching thin film transistor is connected to the gate line, and a source electrode of the switching thin film transistor is connected to the data line. The gate electrode 132 of the driving thin film transistor is connected to a drain electrode of the switching thin film transistor, and the source electrode 152 of the driving thin film transistor is connected to the power supply line.

As stated above, the drain electrode 154 of the driving thin film transistor is connected to the first electrode 172 of the organic light emitting diode De, and the drain electrode 154 of the driving thin film transistor is also connected to the first capacitor electrode 116 and the third capacitor electrode 156 of the storage capacitor. The gate electrode 132 of the driving thin film transistor is connected to the second capacitor electrode 136 of the storage capacitor.

The positions and names of the source electrode 152 and the drain electrode 154 of the driving thin film transistor are determined according to carriers, and the positions and names of the source electrode 152 and the drain electrode 154 may be changed to each other.

In the meantime, as mentioned above, the storage capacitor of the present invention includes the first and second capacitors C1 and C2 connected in parallel and has larger capacitance than a capacitor having the same area as the storage capacitor of the present invention. At this time, to decrease a distance between the first capacitor electrode 116 and the second capacitor electrode 136, the gate insulating layer 130 between the first capacitor electrode 116 and the second capacitor electrode 136 is removed, and the buffer layer 120 is prevented from being etched by using the second oxide semiconductor layer 126 as an etching-prevention layer. Since the second oxide semiconductor layer 126 has a thinner thickness than the gate insulating layer 130, the distance between the first and second capacitor electrodes 116 and 136 decreases, and the capacitance of the first capacitor C1 further increases.

Accordingly, the area for the storage capacitor can be decreased by an increase in the capacitance. The effective emission area where light from the organic light emitting layer 182 is emitted increases in the bottom emission type OLED display device, and brightness of the display device increases.

The structure of the storage capacitor of the present invention may be applied to a top emission type OLED display device in addition to the bottom emission type OLED display device. That is, the OLED display device may be a top emission type where the first electrode 172 is formed of an opaque conductive material or includes a transparent conductive layer and a reflective layer under the transparent conductive layer, the second electrode 182 transmits light, and light from the organic light emitting layer 182 is outputted to the outside through the second electrode 192. At this time, since the area for the storage capacitor decreases by an increase in the capacitance of the first capacitor C1, other thin film transistors and capacitors for compensation can be added, and design margins increase.

Hereinafter, a method of fabricating an OLED display device according to an embodiment of the present disclosure with reference to accompanying drawings.

FIGS. 3A to 3J are cross-sectional views of an OLED display device in steps of fabricating the display device according to an embodiment of the present disclosure.

Figure 3A:
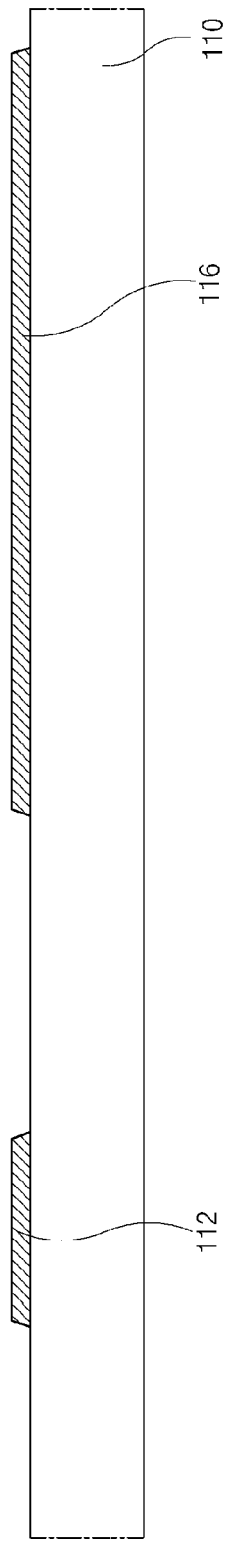

In FIG. 3A, a first conductive material layer (not shown) is formed on an insulating substrate 110 by depositing a conductive material such as metal by a sputtering method, for example, and the first conductive material layer is selectively removed through a photolithographic process using a mask, thereby forming a light-blocking layer 112 and a first capacitor electrode 116.

Here, the insulating substrate 110 may be a glass substrate or a plastic substrate. The light-blocking layer 112 and the first capacitor electrode 116 may be formed of at least one of aluminum (Al), copper (Cu), molybdenum (Mo), chromium (Cr), nickel (Ni), tungsten (W), and an alloy thereof.

In FIG. 3B, a buffer layer 120 is formed on the light-blocking layer 112 and the first capacitor electrode 116 by depositing an insulating material substantially all over the substrate 110. The buffer layer 120 may be formed of an inorganic insulating material such as silicon oxide ($SiO_2$).

Next, an oxide semiconductor layer (not shown) is formed on the buffer layer 120 by depositing an oxide semiconductor material, and the oxide semiconductor layer is selectively removed through a photolithographic process using a mask, thereby forming a first oxide semiconductor layer 122 over the light-blocking layer 112 and a second oxide semiconductor layer 126 over the first capacitor electrode 116. Here, the first oxide semiconductor layer 122 has a wider width than the light-blocking layer 112, and a central portion of the first oxide semiconductor layer 122 overlaps the light-blocking layer 112. Meanwhile, the second oxide semiconductor layer 126 overlaps the first capacitor electrode 116. At this time, the second oxide semiconductor layer 126 has a smaller area than the first capacitor electrode 116, and a portion of the first capacitor electrode 116 does not overlap the second oxide semiconductor layer 126.

In one or more embodiments, the second semiconductor layer 126 and the first semiconductor layer 122 are formed in a same process with a same thickness. The first and second oxide semiconductor layers 122 and 126 may be formed of indium gallium zinc oxide (IGZO), indium tin zinc oxide (ITZO), indium zinc oxide (IZO), zinc oxide (ZnO), indium gallium oxide (IGO), or indium aluminum zinc oxide (IAZO).

In FIG. 3C, a gate insulating layer 130 is formed on the first and second oxide semiconductor layers 122 and 126 by depositing an insulating material substantially all over the substrate 110 by a chemical vapor deposition method, for example. The gate insulating layer 130 may be formed of an inorganic insulating material such as silicon oxide ($SiO_2$).

Next, the gate insulating layer 130 and the buffer layer 120 thereunder are selectively removed through a photolithographic process using a mask, thereby forming a hole 130a exposing the second oxide semiconductor layer 126, a capacitor contact hole 130b exposing the first capacitor electrode 116, and a gate contact hole (not shown) exposing the light-blocking layer 112. Here, the hole 130a is formed only in the gate insulating layer 130, and the capacitor contact hole 130b and the gate contact hole are formed in the gate insulating layer 130 and the buffer layer 120. In other words, forming the gate insulating layer includes forming at least one hole (e.g., 130a) in the gate insulating layer 130 in a region where the gate insulating layer 130 overlaps the second semiconductor layer 126, by patterning the gate insulating layer 130.

Figure 3D:
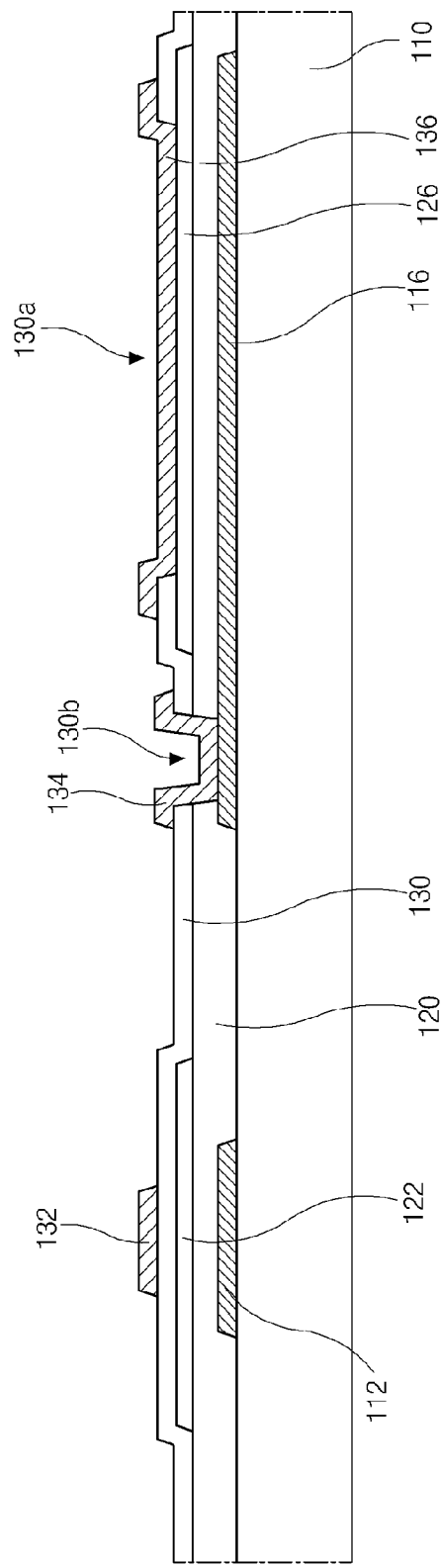

In FIG. 3D, a second conductive material layer (not shown) is formed on the gate insulating layer 130 by depositing a conductive material such as metal by a sputtering method, for example, and the second conductive material layer is selectively removed through a photolithographic process using a mask, thereby forming a gate electrode 132, a connection pattern 134, a second capacitor electrode 136, and a gate line (not shown).

The gate electrode 132 has a narrower width than the light-blocking layer 112 and overlaps the light-blocking layer 112. The gate electrode 132 contacts the light-blocking layer 112 through the gate contact hole (not shown). The connection pattern 134 contacts the first capacitor electrode 116 through the capacitor contact hole 130b. The second capacitor electrode 136 is spaced apart from the connection pattern 134, and the second capacitor electrode 136 overlaps the first capacitor electrode 116 and contacts the second oxide semiconductor layer 126 through the hole 130a. In other words, the second semiconductor layer 126 is exposed through the gate insulating layer 130 (at hole 130a) to the second capacitor electrode 136. In such embodiments, the second semiconductor layer 126 is formed thinner than the gate insulating layer 130. Although not shown in the figure, the second capacitor electrode 136 is connected to the gate electrode 132, and the gate line extends in a first direction.

The gate electrode 132, the connection pattern 134, the second capacitor electrode 136, and the gate line may be formed of at least one of aluminum (Al), copper (Cu), molybdenum (Mo), chromium (Cr), nickel (Ni), tungsten (W), and an alloy thereof.

Figure 3E:
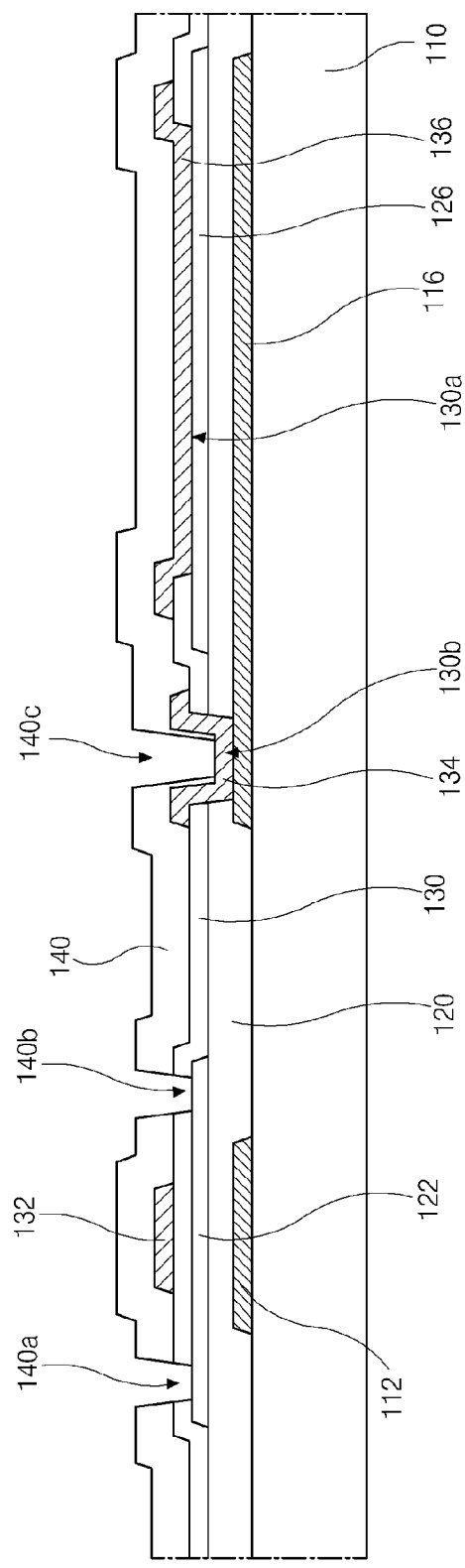

In FIG. 3E, an inter insulating layer 140 is formed on the gate electrode 132, the connection pattern 134, the second capacitor electrode 136, and the gate line by depositing or applying an insulating material substantially all over the substrate 110, and the inter insulating layer 140 is selectively removed through a photolithographic process using a mask, thereby forming first and second contact holes 140a and 140b and a third contact hole 140c. The first and second contact holes 140a and 140b expose top surfaces of both sides of the first oxide semiconductor layer 122, respectively, and the third contact hole 140c exposes the connection pattern 134. Although the third contact hole 140c is disposed directly over the capacitor contact hole 130b, the third contact hole 140c may be spaced apart from the capacitor contact hole 130b.

The inter insulating layer 140 may be formed of an inorganic insulating material such as silicon oxide ($SiO_2$) and silicon nitride (SiNx) or an organic insulating material such as benzocyclobutene and photo acryl.

Figure 3F:
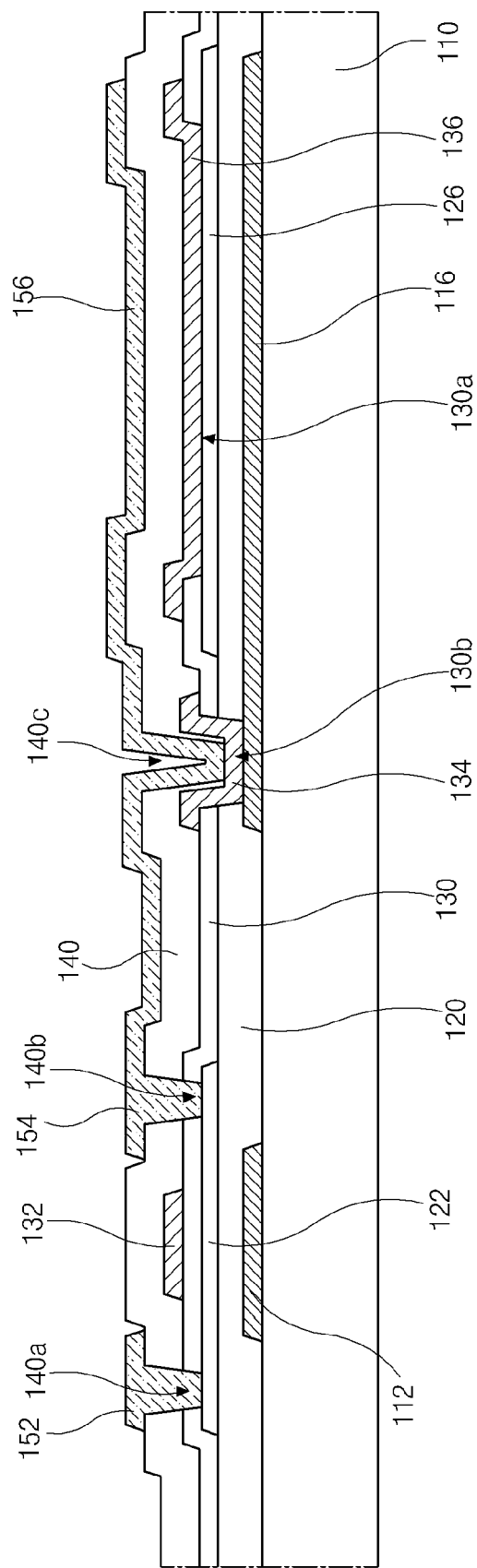

Next, in FIG. 3F, a third conductive material layer (not shown) is formed on the inter insulating layer 140 by depositing a conductive material such as metal by a sputtering method, for example, and the third conductive material layer is selectively removed through a photolithographic process using a mask, thereby forming source and drain electrodes 152 and 154, a third capacitor electrode 156, a data line (not shown), and a power supply line (not shown).

The source and drain electrodes 152 and 154 are spaced apart from each other with respect to the gate electrode 132. The source and drain electrodes 152 and 154 contact both sides of the first oxide semiconductor layer 122 through the first and second contact holes 140a and 140b, respectively. In addition, the source and drain electrodes 152 and 154 are spaced apart from the gate electrode 132 and overlap the light-blocking layer 112. The drain electrode 154 is connected to the third capacitor electrode 156 and contacts the connection pattern 134 through the third contact hole 140c. In the meantime, the third capacitor electrode 156 overlaps the second capacitor electrode 136. The data line and the power supply line extend in a second direction. The data line crosses the gate line to define a pixel region.

As stated above, the drain electrode 154 may directly contact the first capacitor electrode 116. Namely, the capacitor contact hole 130a and the connection pattern 134 may be omitted, and the third contact hole 140c may be formed in the inter insulating layer 140, the gate insulating layer 130 and the buffer layer 120 to expose the first capacitor electrode 116. The drain electrode 154 may contact the first capacitor electrode 116 through the third contact hole 140c.

The source and drain electrodes 152 and 154, the third capacitor electrode 156, the data line and the power supply line may be formed of at least one of aluminum (Al), copper (Cu), molybdenum (Mo), chromium (Cr), nickel (Ni), tungsten (W), and an alloy thereof.

Figure 3G:
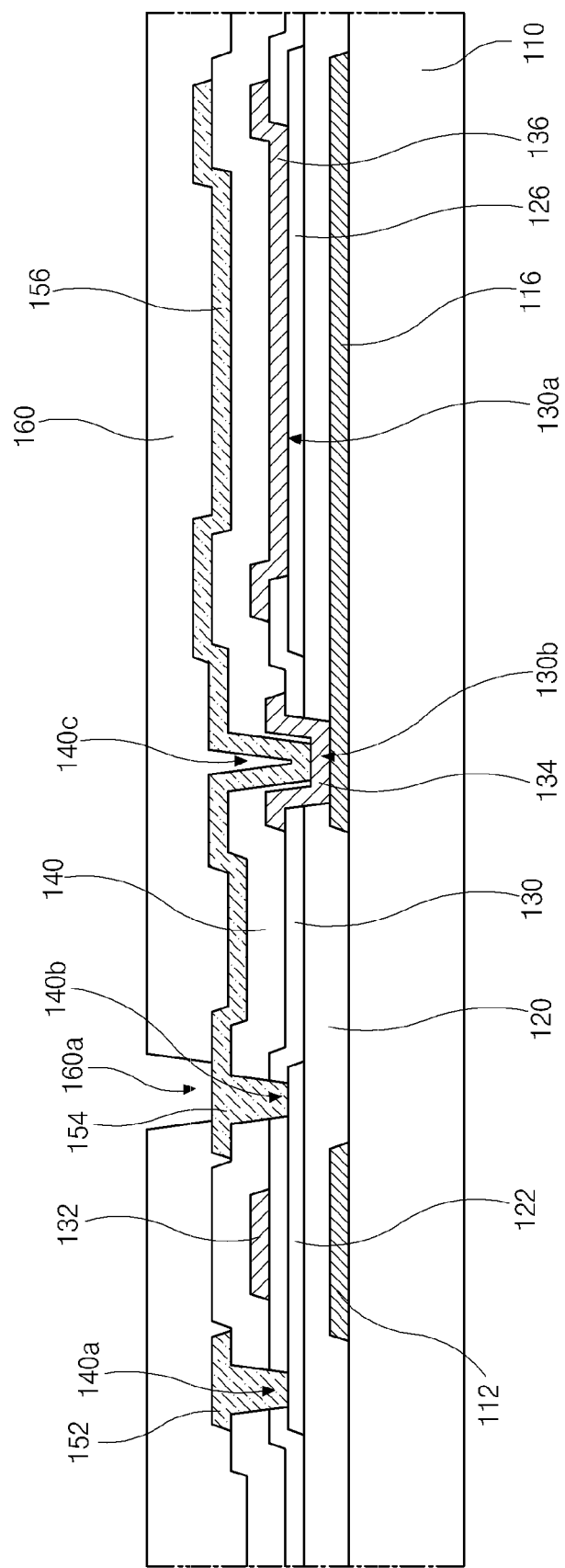

In FIG. 3G, a passivation layer 160 is formed on the source and drain electrodes 152 and 154, the third capacitor electrode 156, the data line and the power supply line by depositing or applying an insulating material substantially all over the substrate 110, and the passivation layer 160 is selectively removed through a photolithographic process using a mask, thereby forming a drain contact hole 160a exposing the drain electrode 154. The drain contact hole 160a is formed directly over the second contact hole 140b. Alternatively, the drain contact hole 160a may be spaced apart from the second contact hole 140b.

The passivation layer 160 may be formed of an inorganic insulating material such as silicon oxide ($SiO_2$) and silicon nitride (SiNx) or an organic insulating material such as benzocyclobutene and photo acryl. Beneficially, the passivation layer 160 may be formed of an organic insulating material to flatten a top surface thereof.

Figure 3H:
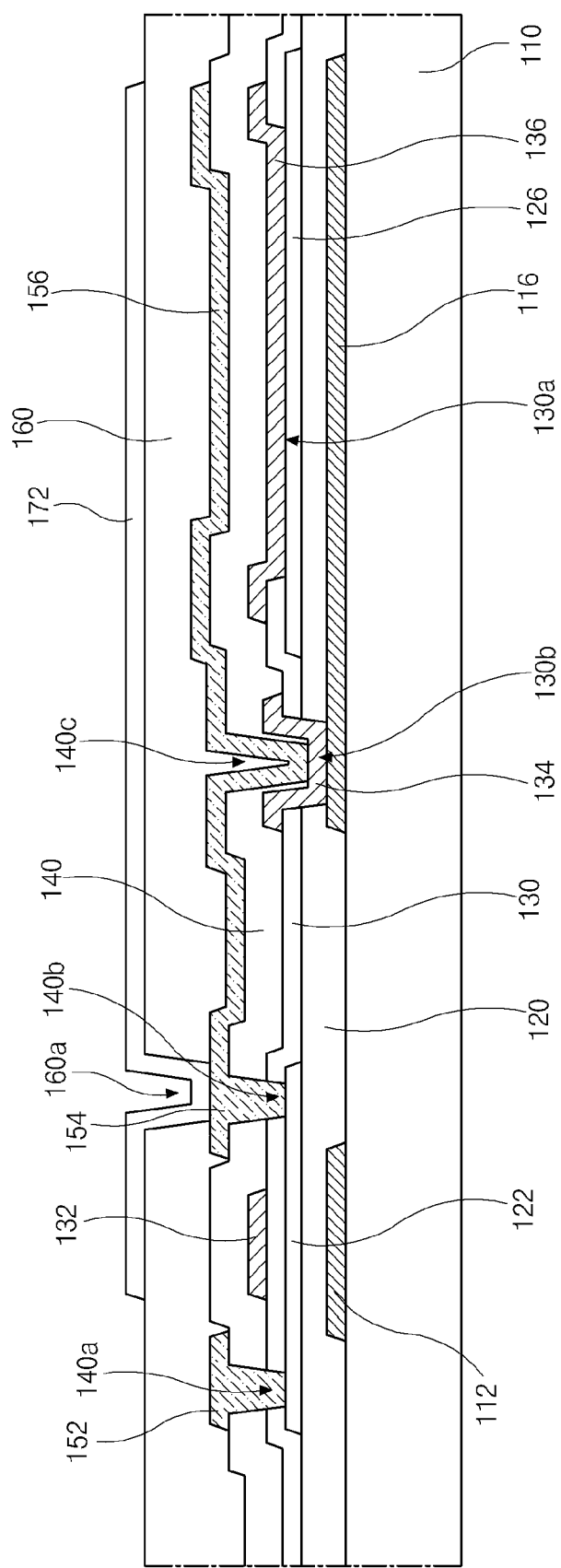

Next, in FIG. 3H, a first electrode material layer (not shown) is formed on the passivation layer 160 by depositing a conductive material having relatively high work function by a sputtering method, for example, and the first electrode material layer is selectively removed through a photolithographic process using a mask, thereby forming a first electrode 172. The first electrode 172 is disposed in each pixel region and is connected to the drain electrode 154 through the drain contact hole 160a.

The first electrode 172 may be formed of a transparent conductive material such as indium tin oxide and indium zinc oxide.

Figure 3I:
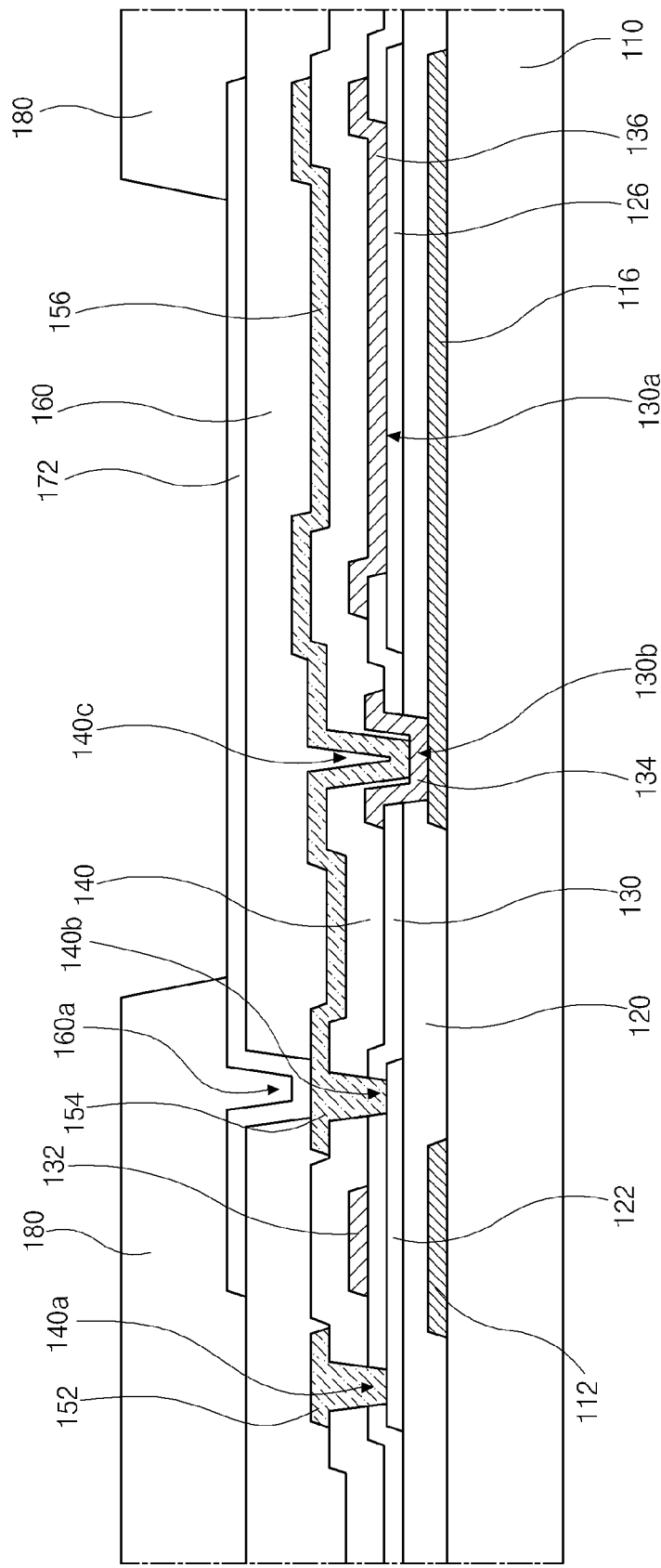

In FIG. 3I, a bank material layer (not shown) is formed on the first electrode 172 by depositing or applying an insulating material, and the bank material layer is selectively removed through a photolithographic process using a mask, thereby forming a bank layer 180. The bank layer 180 covers edges of the first electrode 172 and exposes a central portion of the first electrode 172.

Meanwhile, although not shown in the figure, a spacer may be further formed on the bank layer 180.

Figure 3J:
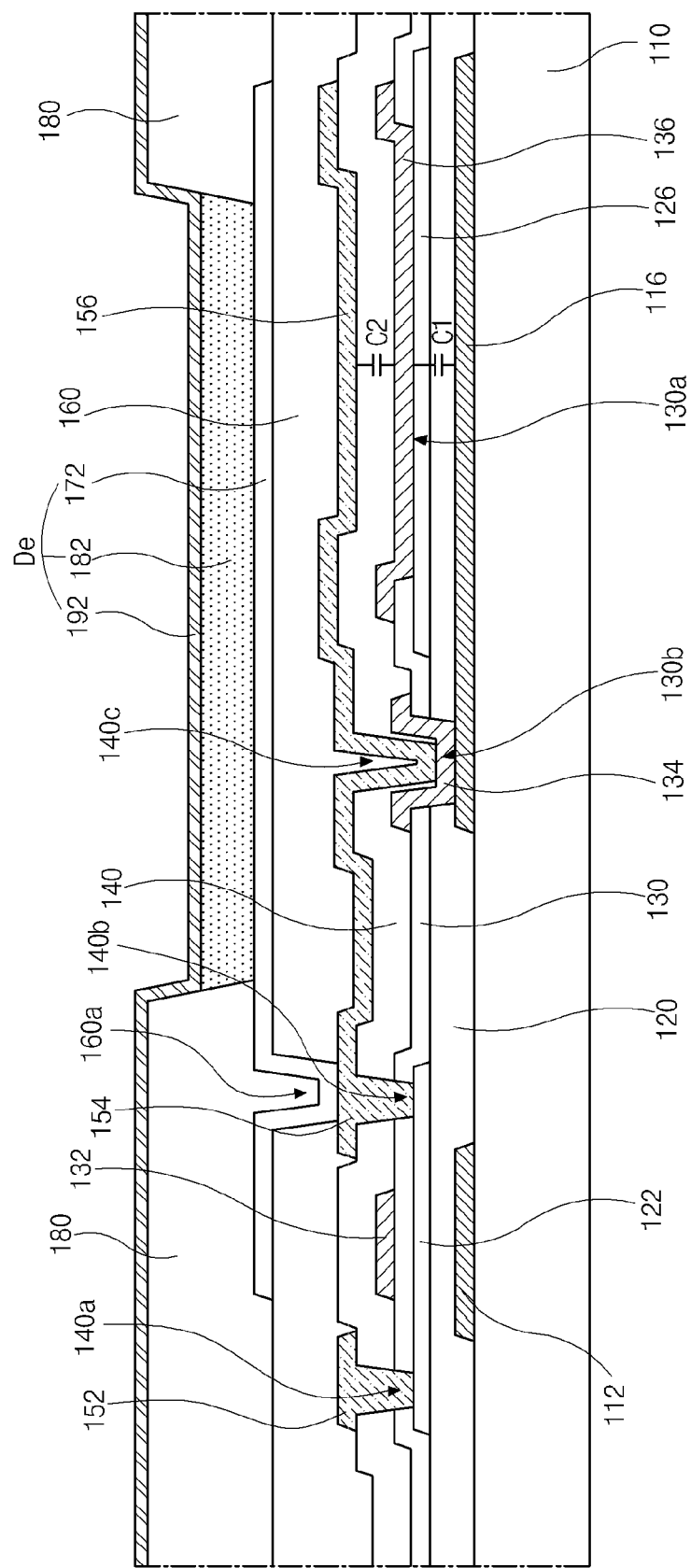

In FIG. 3J, an organic light emitting layer 182 is formed on the first electrode 172 exposed by the bank layer 180 by selectively depositing an organic material over the substrate 110 including the bank layer 180 by an evaporation method, for example. The organic light emitting layer 182 may have a multi-layered structure of a hole transporting layer, a light-emitting material layer, and an electron transporting layer sequentially layered on the first electrode 172. The organic light emitting layer 182 may further include a hole injecting layer under the hole transporting layer and an electron injecting layer on the electron transporting layer.

Next, a second electrode 192 is formed on the organic light emitting layer 182 by depositing a conductive material having relatively low work function substantially all over the substrate 110 by a sputtering method, for example.

The second electrode 192 may be formed of an opaque metallic material such as aluminum and chromium.

The first electrode 172, the organic light emitting layer 182 and the second electrode 192 constitute an organic light emitting diode De. The first electrode 172 functions as an anode, and the second electrode 192 serves as a cathode. Here, the OLED display device may be a bottom emission type in which light from the organic light emitting layer 182 is outputted to the outside through the first electrode 172. Alternatively, the OLED display device may be a top emission type where a reflective layer is further formed under the first electrode 172 and a thickness of the second electrode 182 is adjusted to transmit light.

In the present invention, a storage capacitor is formed by first and second capacitors C1 and C2, which are constituted by the first, second and third capacitor electrodes 116, 136 and 156 and are connected to each other in parallel. Here, when the gate contact hole (not shown) and the storage contact hole 130b are formed, the gate insulating layer 130 between the first capacitor electrode 116 and the second capacitor electrode 136 is removed using the second oxide semiconductor layer 126 as an etching prevention layer. Thus, without an increase in a process, since a thickness of the second oxide semiconductor layer 126 is thinner than the gate insulating layer 130, a distance between the first and second capacitor electrodes 116 and 136 decreases, and the capacitance of the first capacitor C1 increases. Therefore, an area for the storage capacitor can be decreased by the increase in the capacitance. Accordingly, in the bottom emission type OLED display device, the effective emission area, and brightness of the display device increases. In the top emission type OLED display device, other thin film transistors and capacitors for compensation can be added, and design margins increase.

In the embodiment of the present invention, the thin film transistor includes oxide semiconductor as an active layer. Alternatively, the thin film transistor may include low temperature polycrystalline silicon (LTPS) as an active layer. In this case, a step of doping impurities may be further performed, and the gate insulating layer 130 and the buffer layer 120 may be formed of an inorganic insulating material such as silicon nitride (SiNx) in addition to silicon oxide (SiO$_2$).

Meanwhile, in the embodiment of the present disclosure, the storage capacitor has one hole 130a exposing the second oxide semiconductor layer 126. Alternatively, the number and size of holes and a distance between adjacent holes may be varied. In other words, in one or more embodiments, the gate insulating layer 130 has a plurality of spatially separated holes in the region where the storage capacitor is formed, between the second capacitor electrode 136 and the second semiconductor layer 126 to expose the second semiconductor layer 126 to the second capacitor electrode 136. Furthermore, the gate insulating layer 130 extends partially into a region between the second capacitor electrode 136 and the second semiconductor layer 126 to cover a part of the second semiconductor layer 126.

Figure 4A:
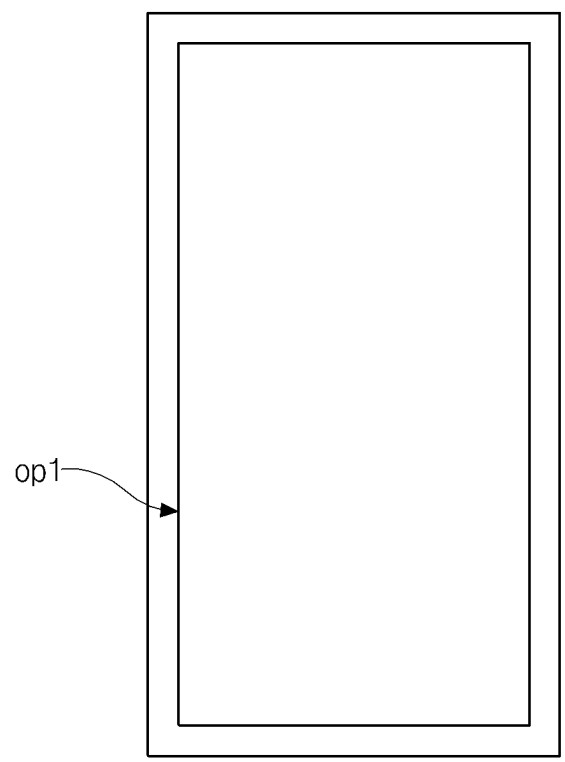
FIGS. 4A to 4C are views of schematically illustrating holes of a storage capacitor according to an embodiment of the present disclosure.
Figure 4B:
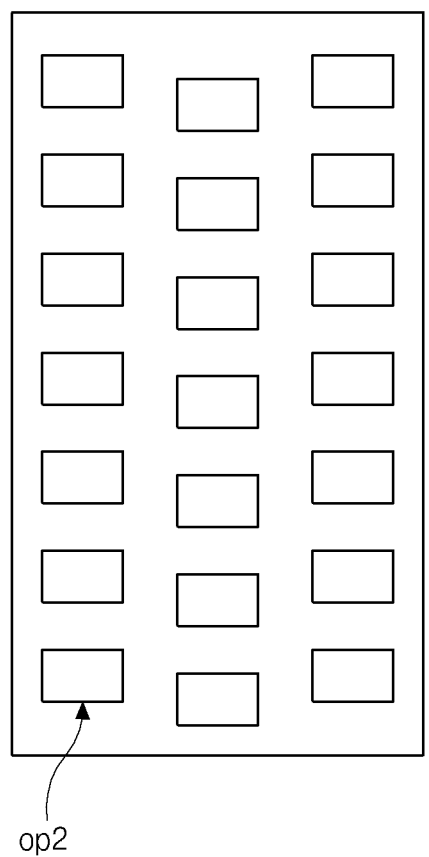
Figure 4C:
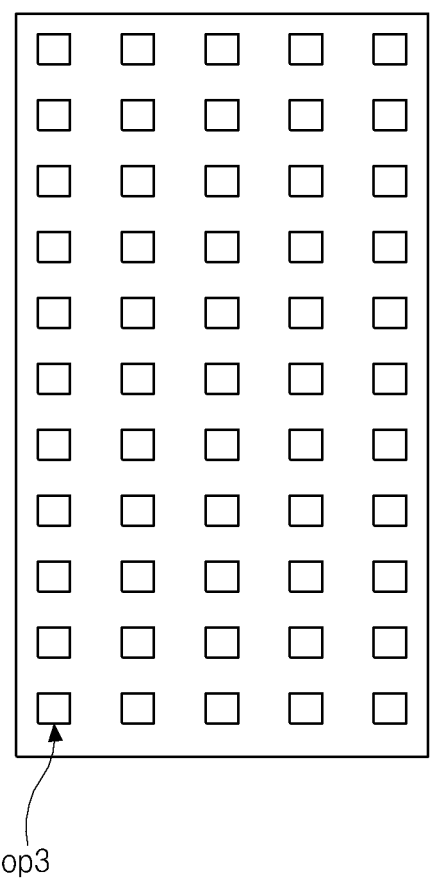

FIGS. 4A to 4C are views of schematically illustrating holes of a storage capacitor according to an embodiment of the present invention. FIGS. 4A to 4C show the number and size of holes and the distance between adjacent holes with respect to an area of the storage capacitor.

In FIG. 4A, the storage capacitor may include a hole op1, and the hole op1 may have a size corresponding to electrodes of the storage capacitor. For example, the size of the hole op1 may be 34 micrometers by 84 micrometers.

In FIG. 4B, the storage capacitor may include a plurality of holes op2. For example, the number of holes op2 may be 21, the size of each hole op2 may be 8 micrometers by 6 micrometers, and the holes op2 may be disposed with a distance of about 6 micrometers therebetween.

In FIG. 4C, the storage capacitor may include a plurality of holes op3. For example, the number of holes op3 may be 55, the size of each hole op3 may be 3 micrometers by 3 micrometers, and the holes op3 may be disposed with a distance of about 5 micrometers therebetween.

For instance, in a reference case that the storage capacitor does not include a hole, the capacitance of the storage capacitor is 512.6 fF. In FIG. 4A where the storage capacitor includes the hole op1, the capacitance is 723.8 fF and increases by about 141.2% as compared with the reference case. In FIG. 4B where the storage capacitor includes the holes op2, the capacitance is 695 fF and increases by about 135.58% as compared with the reference case. In FIG. 4C where the storage capacitor includes the holes op3, the capacitance is 733.8 fF and increases by about 143.15% as compared with the reference case.

Here, the holes op3 of FIG. 4C have a smaller total area than the hole op1 of FIG. 4A, and the capacitance in FIG. 4C is larger than the capacitance in FIG. 4A because of a fringe field effect at edges of the holes op3.

Accordingly, the storage capacitor with the hole op1 or holes op2 or op3 can have the capacitance increased by about 35% to about 43% in comparison to the storage capacitor without a hole.

In the present invention, by forming the hole or holes having various sizes, numbers and distances therebetween, the capacitance of the storage capacitor can be increased.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An organic light emitting diode display device comprising:
    a driving thin film transistor including a first semiconductor layer, a gate insulating layer formed on the first semiconductor layer, a gate electrode formed on the gate insulating layer, a source electrode, and a drain electrode, the source electrode and the drain electrode formed co-planar with the gate electrode on a same side with respect to the gate insulating layer;
    a storage capacitor including a first capacitor electrode electrically coupled to the drain electrode of the driving thin film transistor, a buffer layer formed on the first capacitor electrode, a second semiconductor layer formed on the buffer layer, and a second capacitor electrode formed on the second semiconductor layer and electrically coupled to the gate electrode of the driving thin film transistor; and
    an organic light emitting diode (OLED) connected to the drain electrode of the driving thin film transistor and configured to emit light by current driven through the OLED by the driving thin film transistor,
    wherein the gate insulating layer has at least one hole in a region where the gate insulating layer overlaps the second semiconductor layer, thereby exposing the second semiconductor layer to the second capacitor electrode.

2. The organic light emitting diode display device of claim 1, wherein the second semiconductor layer is formed thinner than the gate insulating layer.

3. The organic light emitting diode display device of claim 1, wherein the storage capacitor further includes an insulating layer formed on the second capacitor electrode and a third capacitor electrode formed on the insulating layer and electrically coupled to the drain electrode.

4. The organic light emitting diode display device of claim 1, wherein the first semiconductor layer and the second semiconductor layer include an oxide semiconductor material.

5. The organic light emitting diode display device of claim 1, further comprising a light-blocking layer disposed under the first semiconductor layer and electrically connected to the gate electrode.

6. The organic light emitting diode display device of claim 1, further comprising a connection pattern between the drain electrode and the first capacitor electrode and disposed on a same layer as the second capacitor electrode, the gate insulating layer absent in a region surrounding the connection pattern.

7. A method of fabricating an organic light emitting diode display device, comprising:
    forming a driving thin film transistor including a first semiconductor layer, a gate insulating layer formed on the first semiconductor layer, a gate electrode formed on the gate insulating layer, a source electrode, and a drain electrode, the source electrode and the drain electrode formed co-planar with the gate electrode on a same side with respect to the gate insulating layer;
    forming a storage capacitor including a first capacitor electrode electrically coupled to the drain electrode of the driving thin film transistor, a buffer layer formed on the first capacitor electrode, a second semiconductor layer formed on the buffer layer, and a second capacitor electrode formed on the second semiconductor layer and electrically coupled to the gate electrode of the driving thin film transistor; and
    forming an organic light emitting diode (OLED) connected to the drain electrode of the driving thin film transistor and configured to emit light by current driven through the OLED by the driving thin film transistor,
    wherein the buffer layer, the second semiconductor layer and the gate insulating layer are formed subsequent to forming of the first capacitor electrode and prior to forming of the second capacitor electrode, and
    wherein forming the gate insulating layer includes forming at least one hole in the gate insulating layer in a region where the gate insulating layer overlaps the second semiconductor layer by patterning the gate insulating layer to expose the second semiconductor layer through the gate insulating layer to the second capacitor electrode.

8. The method of claim 7, wherein the second semiconductor layer is formed thinner than the gate insulating layer.

9. The method of claim 7, wherein forming the storage capacitor further includes forming an insulating layer on the second capacitor electrode and forming a third capacitor electrode on the insulating layer to be electrically coupled to the drain electrode.

10. The method of claim 7, further comprising forming a light-blocking layer disposed under the first semiconductor layer and electrically connected to the gate electrode.

11. The method of claim 7, wherein forming the second capacitor electrode includes forming a connection pattern between the drain electrode and the first capacitor electrode.

* * * * *